US010103086B2

(12) United States Patent
Lin

(10) Patent No.: US 10,103,086 B2
(45) Date of Patent: Oct. 16, 2018

(54) FIXING FRAME FOR HEAT SINK

(71) Applicant: ABLECOM TECHNOLOGY INC., New Taipei (TW)

(72) Inventor: Chen-Tang Lin, New Taipei (TW)

(73) Assignee: ABLECOM TECHNOLOGY INC., New Taipei (TW)

( * ) Notice: Subject to any disclaimer, the term of this patent is extended or adjusted under 35 U.S.C. 154(b) by 18 days.

(21) Appl. No.: 15/381,121

(22) Filed: Dec. 16, 2016

(65) Prior Publication Data

US 2018/0173281 A1 Jun. 21, 2018

(51) Int. Cl.
*H01L 23/40* (2006.01)
*H05K 7/20* (2006.01)
*G06F 1/20* (2006.01)

(52) U.S. Cl.
CPC ............ *H01L 23/4093* (2013.01); *G06F 1/20* (2013.01); *H05K 7/2039* (2013.01); *H01L 23/40* (2013.01)

(58) Field of Classification Search
CPC .. H05K 7/2039; H05K 7/2049; H05K 1/0203; H01L 23/40; H01L 23/4093
USPC ................. 361/719, 720, 752; 257/718–719; 24/458, 459, 520; 248/220.21, 222.2, 248/222.14, 560
See application file for complete search history.

(56) References Cited

U.S. PATENT DOCUMENTS 7,639,504 B2 * 12/2009 Kuo .................... H01L 23/4093 165/185
7,859,847 B2 * 12/2010 Barsun ................ H01L 23/4006 165/185
8,320,129 B2 * 11/2012 Chan ....................... H01L 23/36 165/185
2004/0090747 A1 * 5/2004 Wang ................. H05K 13/0069 361/719
2008/0218976 A1 * 9/2008 Chen ................... H01L 23/4006 361/710

* cited by examiner

*Primary Examiner* — Zachary M Pape
(74) *Attorney, Agent, or Firm* — Chun-Ming Shih; HDLS IPR Services

(57) ABSTRACT

A fixing frame for a heat sink includes boards, at least one foldable plate, and connection members. The boards surround a hollow area, and the hollow area includes a main accommodating space and at least one subsidiary accommodating space at one side of the main accommodating space. At least one foldable plate is detachably connected to one of the boards and is disposed in the subsidiary accommodating space. The connection members are disposed on the boards. By means of the connection members, the fixing frame mounts the heat sink on a circuit board of various sizes to dissipate heat therefrom.

13 Claims, 11 Drawing Sheets

FIXING FRAME FOR HEAT SINK

TECHNICAL FIELD

The present invention relates to a support frame and, in particular, to a support frame of a heat sink for electronic components.

BACKGROUND

Electronic components on a computer motherboard cause high temperature in operation. This is especially true for a central processing unit (CPU) having a higher operating speed. In order to keep a computer system operate in a normal state, it is required to install a heat sink onto the electronic components to dissipate heat, so that the system can operate at normal temperatures.

Furthermore, the conventional heat sink installed on the electronic component is typically fixed on the motherboard by means of a fixing frame. However, since the electronic components have various sizes, fixing frames of different sizes and shapes are required to assemble the heat sink to different components, thereby resulting in additional costs for product designs and storage, which is not cost effective and not economical.

The target of the inventor is to solve the above-mentioned problems, on the basis of which the present invention is accomplished.

SUMMARY

It is an object of the present invention to provide a fixing frame for a heat sink, whereby the heat sink can be mounted to a circuit board of various sizes to dissipate heat therefrom, thereby enhancing convenience in use.

Accordingly, the present invention provides a fixing frame for a heat sink, the heat sink being mounted to the fixing frame to dissipate heat from electronic components. The fixing frame includes a plurality of boards, at least one foldable plate and a plurality of connection members. The boards surround a hollow area; the hollow area includes a main accommodating space and at least one subsidiary accommodating space at one side of the main accommodating space. The at least one foldable plate is detachably connected to one of the boards and is disposed in the at least one subsidiary accommodating space. The connection members are disposed on the boards, and the fixing frame is assembled to the heat sink by means of the connection members.

Compared with the conventional techniques, the hollow area of the fixing frame includes a main accommodating space and at least one subsidiary accommodating space. The at least one subsidiary accommodating space is disposed at one side of the main accommodating space and is in communication with the main accommodating space. Furthermore, the foldable plate is detachably connected (by means of a connection rib) to the board of the fixing frame and is disposed in the subsidiary accommodating space. Accordingly, when a length of the circuit board does not exceed the main accommodating space, the circuit board does not exert an external force to the foldable plate, and the foldable plate is still in the subsidiary accommodating space to support the circuit board. On the other hand, the foldable plate can be removed to expose the subsidiary accommodating space by breaking the connection rib with an adequate external force. Accordingly, the fixing frame can be assembled to a circuit board of a different size. Therefore, the fixing frame can be adapted to various sized circuit boards for dissipating heat thereof, thereby enhancing convenience and practicability.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
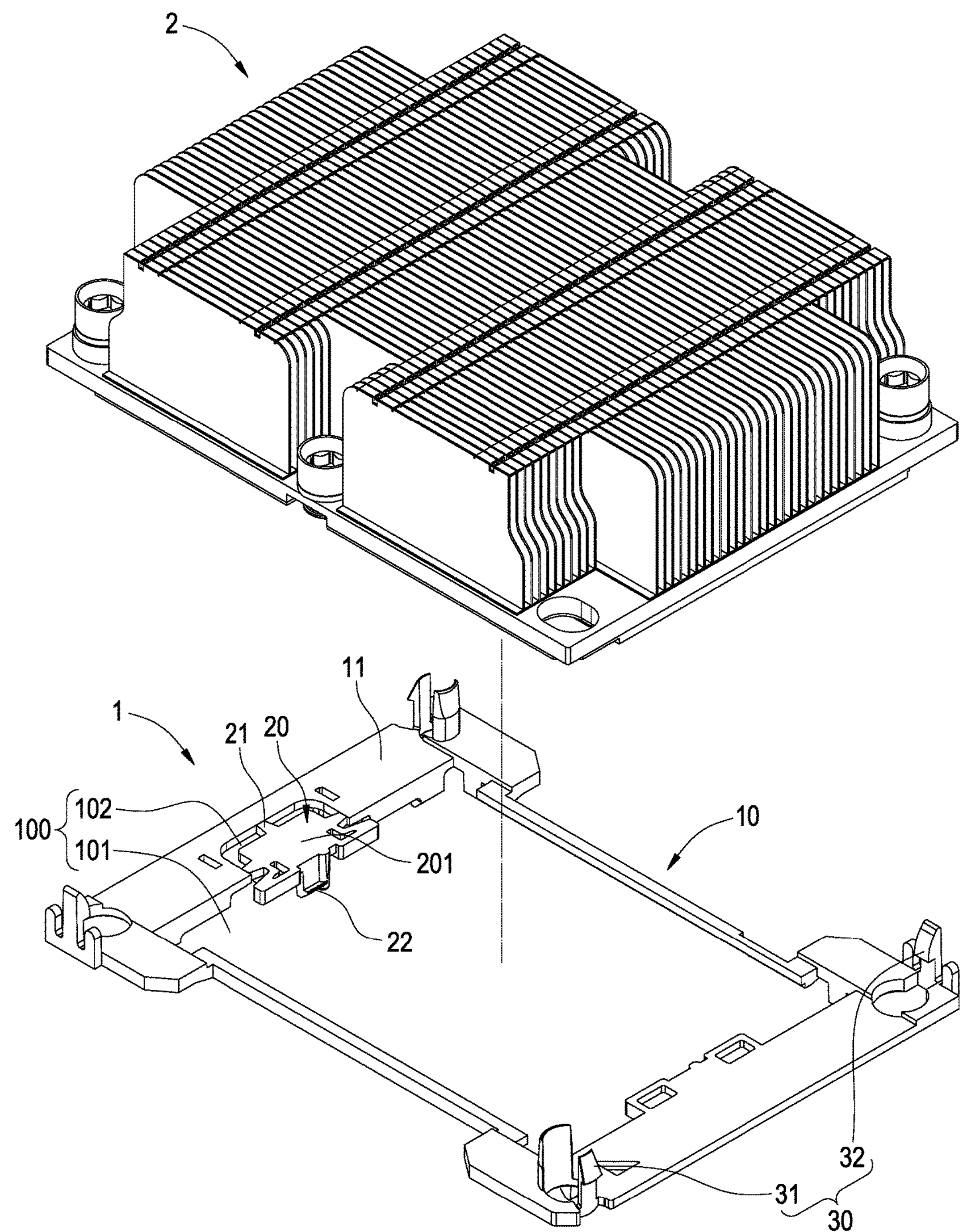
FIG. 1 is a perspective combined view illustrating a heat sink and a fixing frame according to the present invention.

Please refer to FIG. 1, which is a perspective combined view showing a heat sink and a fixing frame. The present invention is a fixing frame 1 for combined with a heat sink 2. The heat sink 2 is in contact with a heat generating element by means of the fixing frame 1 for dissipating heat from the heat generating element. A structure of the fixing frame 1 is more fully detailed below.

Figure 2:
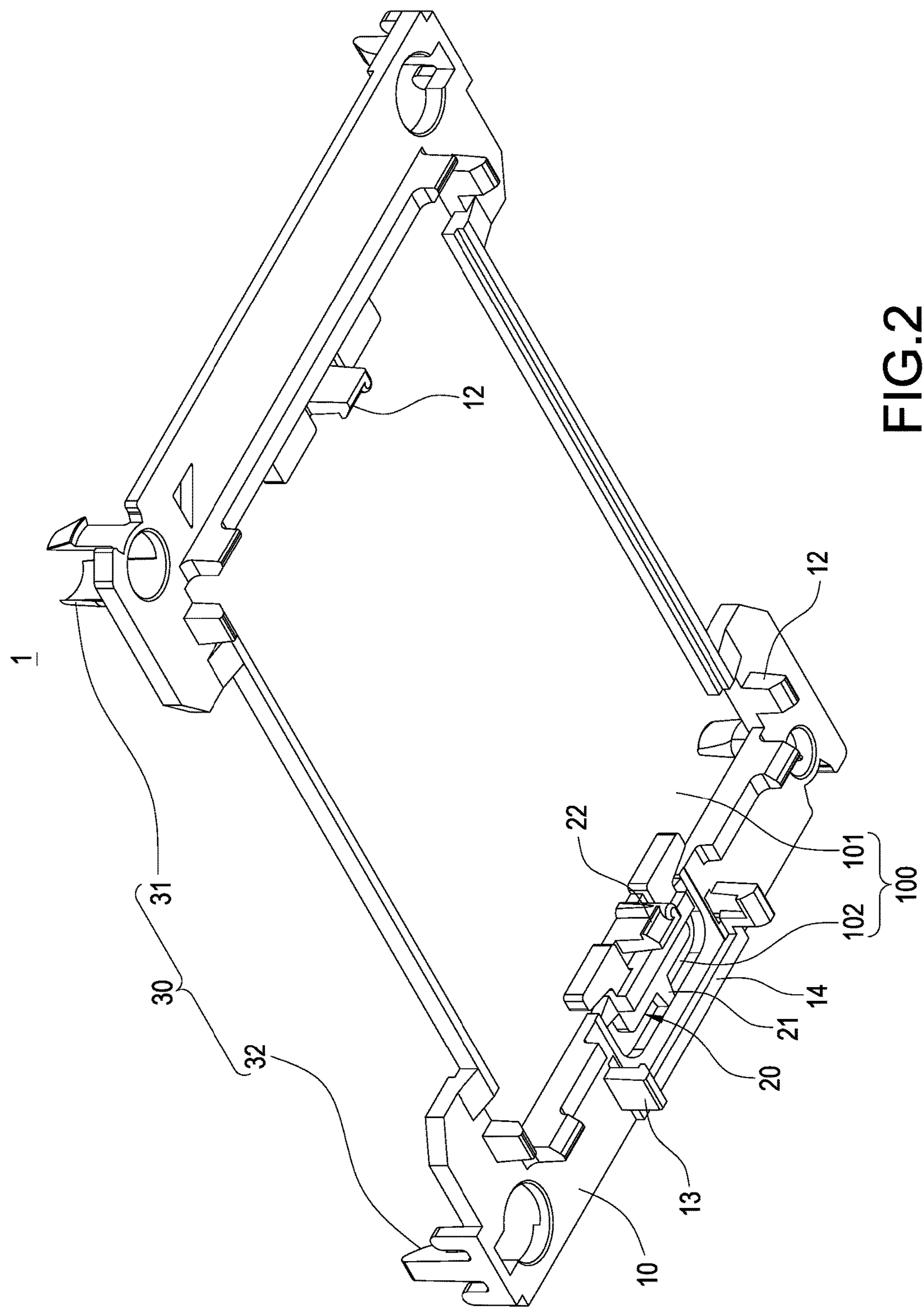
FIG. 2 is a perspective view illustrating the fixing frame according to the present invention.

Please refer to FIG. 2, which is a perspective view showing the fixing frame 1. The fixing frame 1 of the present invention includes a plurality of boards 10, at least one foldable plate 20 and a plurality of connection members 30. It is preferable that the boards 10, the at least one foldable plate 20 and the connection members 30 are integrally formed. The fixing frame 1 can be made from high-temperature plastic by injection molding. Alternatively, the fixing frame 1 can be made from metal by pressing.

As shown in the drawings, in the present embodiment, the boards 10 surround a hollow area 100. The hollow area 100 includes a main accommodating space 101 and at least one subsidiary accommodating space 102 at one side of the main accommodating space 101. At least one foldable plate 20 is detachably connected to one of the boards 10 and disposed in the at least one subsidiary accommodating space 102. In detail, a periphery of the foldable plate 20 includes a plurality of connection ribs 21, and a gap is formed between the connection ribs 21 and the board 10. That is to say, the foldable plate 20 is connected to the board 10 via the connection ribs 21. By exerting an adequate external force to the foldable plate 20, the connection ribs 21 are broken to make the foldable plate 20 detached from the board 10.

According to one embodiment of the present invention, a surface 201 of the foldable plate 20 facing the mounted heat sink 2 is flush with a surface 11 of the board 10 to which the foldable plate 20 is connected. Moreover, the foldable plate 20 includes a clasp 22 at one side away from the heat sink 2.

Figure 3:
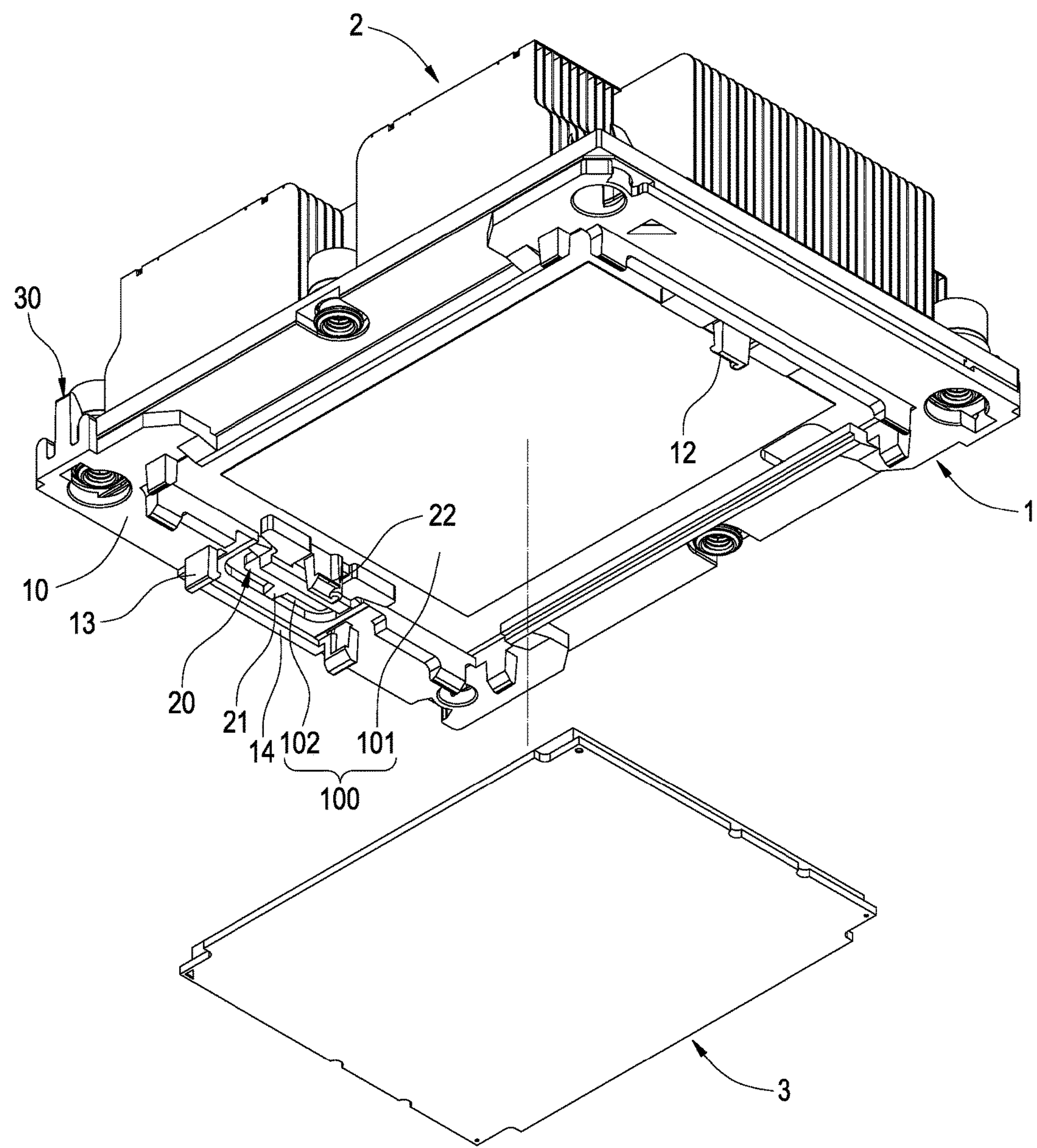
FIG. 3 is a combined view illustrating that the heat sink mounted to the fixing frame is to be assembled to a circuit board.
Figure 4:
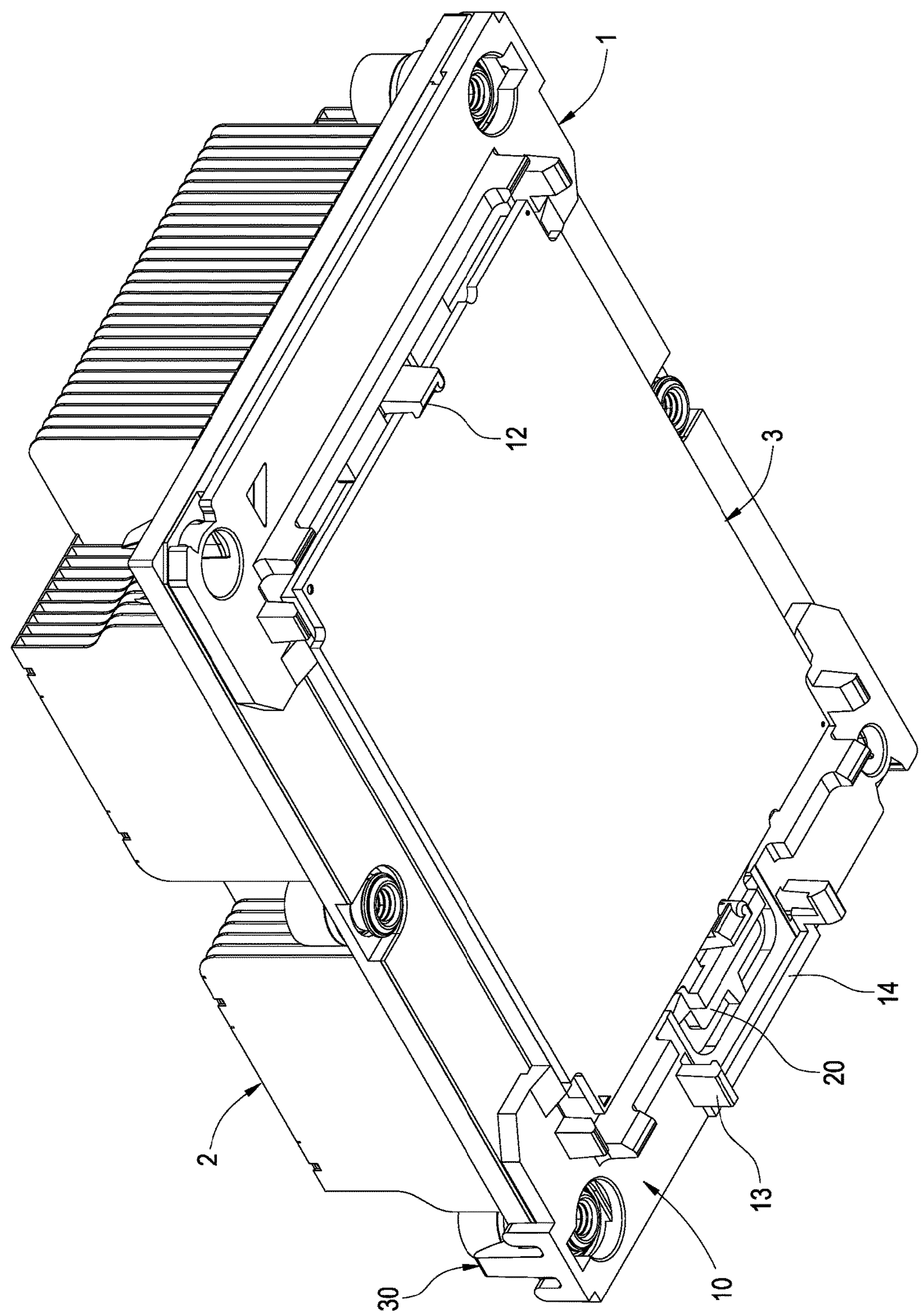
FIG. 4 is a perspective view illustrating that the heat sink mounted to the fixing frame is assembled to the circuit board.

Furthermore, the connection members 30 are disposed on the boards 10. The fixing frame 1 is assembled to the heat sink 2 by means of the connection members 30. In the present embodiment, the connection members 30 include a plurality of flexible fasteners 31 in pairs and a plurality of hooks 32. The flexible fasteners 31 and the hooks 32 are disposed adjacent to corners of the main accommodating space 101. To be specific, the flexible fasteners 31 are arranged at two opposite corners, and the hooks 32 are arranged at two opposite corners. In other words, the flexible fasteners 31 and the hooks 32 connected to the heat sink 2 are arranged symmetrically, thereby enhancing stability of connection. Please refer to FIGS. 3 and 4, i.e. a combined view illustrating that the heat sink mounted to the fixing frame is to be assembled to the circuit board, and a perspective view illustrating that the heat sink mounted to the fixing frame is assembled to the circuit board. In the present embodiment, electronic components (i.e. the heat generating elements) are disposed on a circuit board 3. Furthermore, the boards 10 of the fixing frame 1 include, at one side connected to the electronic components, a plurality of first support clasps 12, and the circuit board 3 is disposed in the main accommodating space 101 and is positioned on the first support clasps 12. In addition, a plurality of second support clasps 13 is disposed at a periphery of the subsidiary accommodating space 102.

It is preferable that the second support clasps 13 are disposed at two opposite edges of the subsidiary accommodating space 102, and a contact block 14 extends from a bottom between the second support clasps 13. Furthermore, an accommodating space is defined in a hollow area 100 formed by the contact block 14 and the boards 10 for insertion and positioning of the circuit board 3.

To be specific, the circuit board 3 is disposed in the main accommodating space 101. When a length of the circuit board 3 does not exceed the main accommodating space 101, the circuit board 3 does not exert an external force to the foldable plate 20. The connection ribs 21 of the foldable plate 20 is not broken by force, so the foldable plate 20 is still in the subsidiary accommodating space 102 and is not detached. Accordingly, the foldable plate 20 is still connected to the board 10, and the clasp 22 of the foldable plate 20 is engaged with one side of the circuit board 22. Furthermore, the first support clasps 12 are engaged with a periphery of the circuit board 3.

Figure 5:
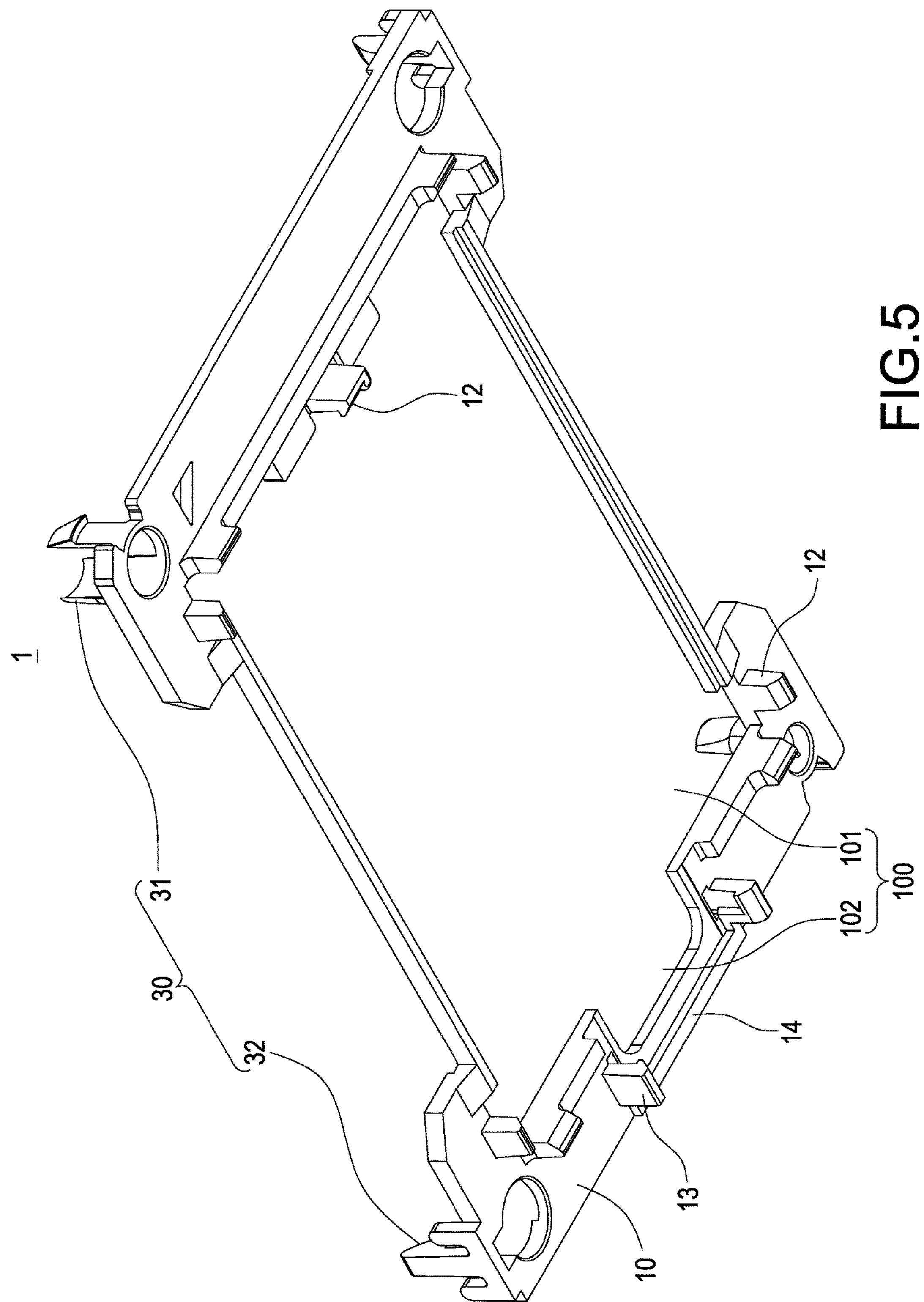
FIG. 5 is a perspective view illustrating that the foldable plate is removed from the fixing frame.
Figure 6:
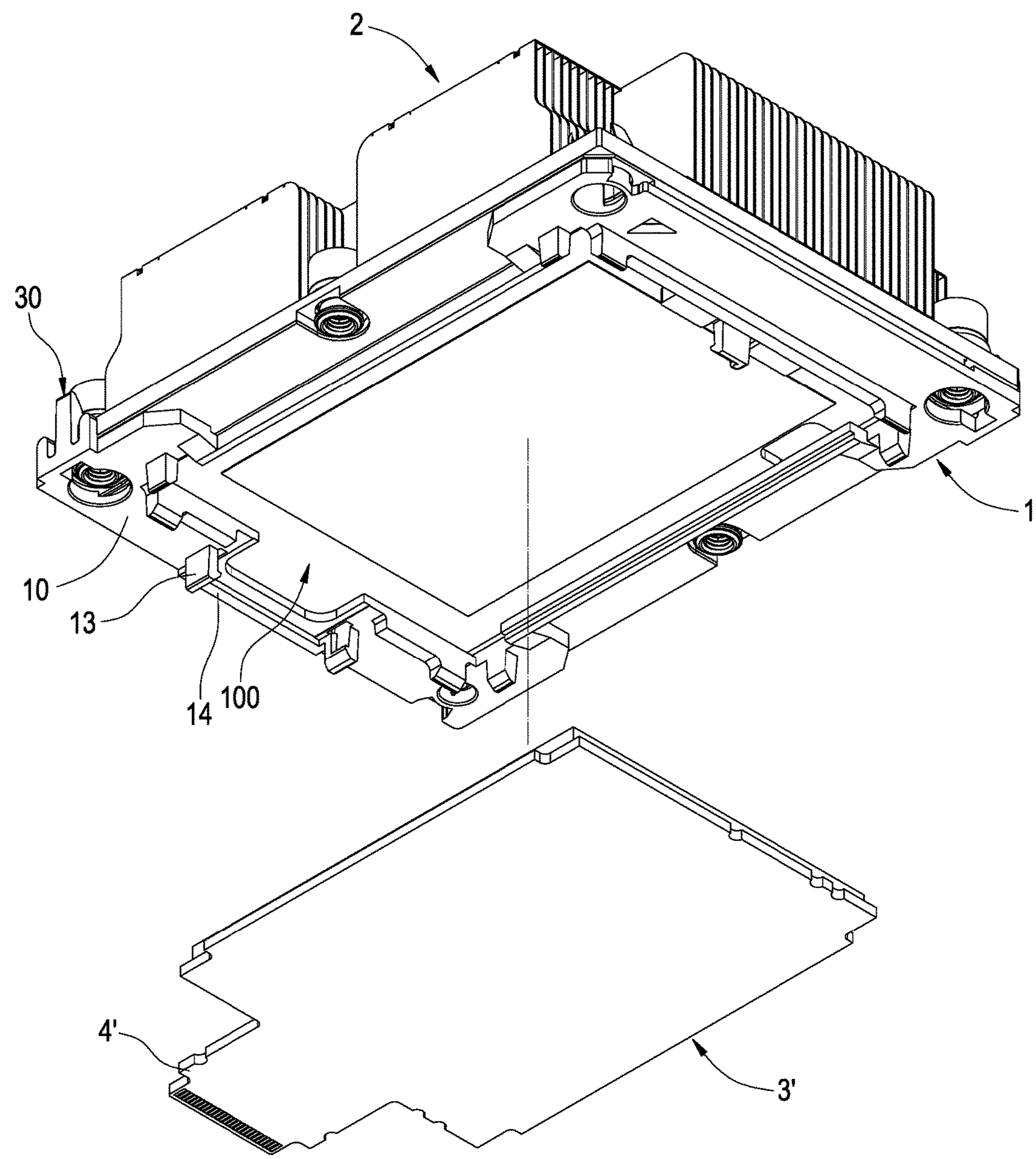
FIG. 6 is a perspective combined view illustrating that the heat sink is to be assembled to the circuit board after the foldable plate of the fixing frame is removed.
Figure 7:
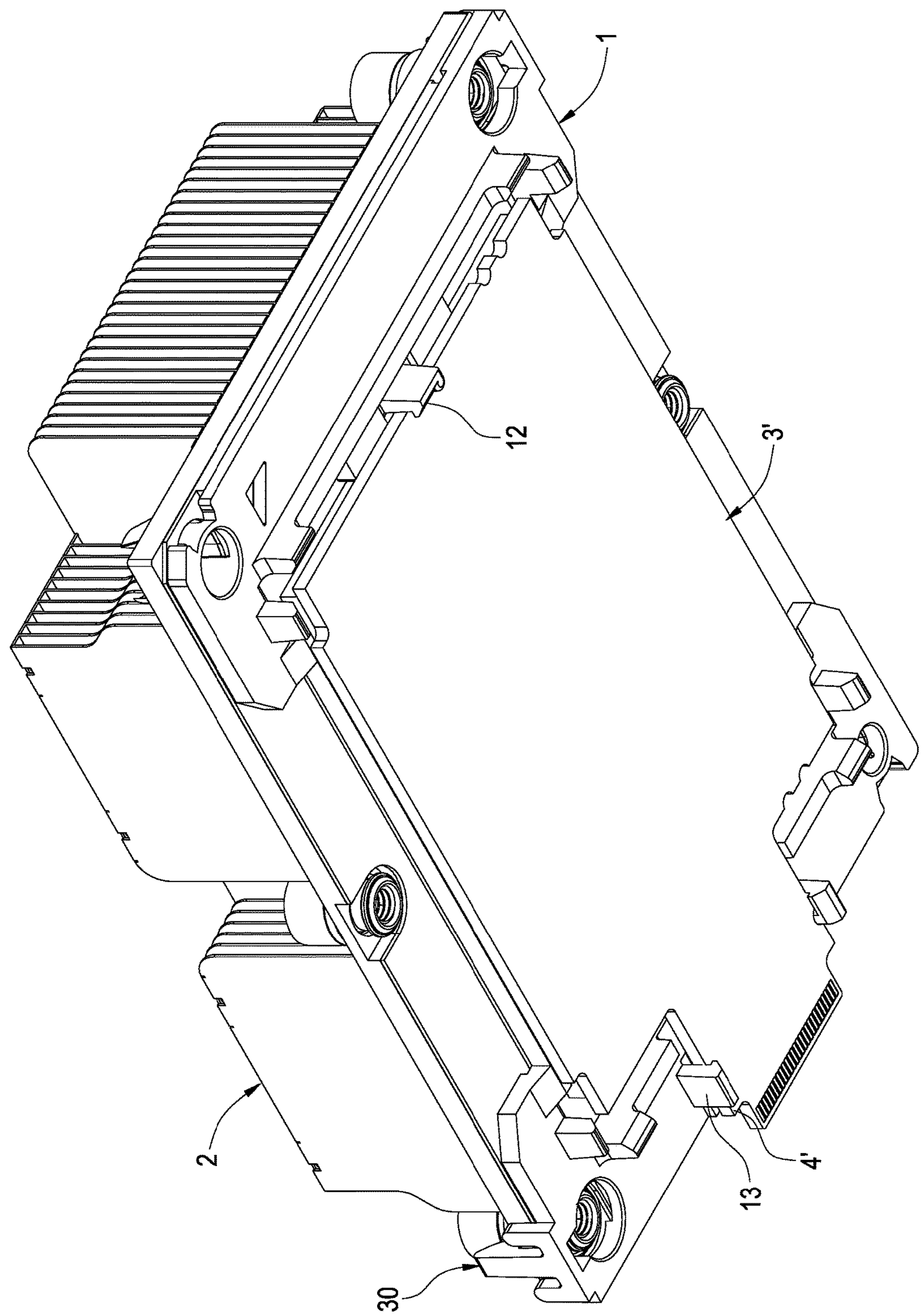
FIG. 7 is a perspective view illustrating that the heat sink is assembled to the circuit board after the foldable plate of the fixing frame is removed.

Please refer to FIGS. 5 to 7, FIG. 5 is a perspective view illustrating that the foldable plate 20 is removed from the fixing frame 1, FIG. 6 is a perspective combined view illustrating that the heat sink 2 is to be assembled to the circuit board 3 after the foldable plate 20 of the fixing frame is removed, and FIG. 7 is a perspective view illustrating that the heat sink 2 is assembled to the circuit board 3 after the foldable plate 20 of the fixing frame 1 is removed. In the fixing frame 1 of the present invention, an adequate external force is exerted to the foldable plate 20 to break the connection ribs 21, so that the foldable plate 20 is detached from the board 10. As shown in FIG. 5, after the foldable plate 20 is removed by the external force, the subsidiary accommodating space 102 is exposed, and the subsidiary accommodating space 102 communicates with the main accommodating space 101. Accordingly, the fixing frame 1 can be assembled to a different size circuit board.

Referring to FIG. 6, in the present embodiment, the electronic component is disposed on a circuit board 3'. The fixing frame 1 is assembled to the heat sink 2 by means of the connection members 30. Accordingly, the heat sink 2 is in contact with the electronic component (the heat generating element) by means of the fixing frame 1. It should be noted that, when the circuit board 3' is inserted in the subsidiary accommodating space 102, the circuit board 3' is in contact with the contact block 14.

As shown in FIG. 7, a length of the circuit board 3' exceeds the main accommodating space 101. As a result, a major portion of the circuit board 3' is disposed in the main accommodating space 101, and a portion of the circuit board 3' protrudes into and is positioned in the subsidiary accommodating space 102. Furthermore, the circuit board 3' is supported and positioned by the first support clasp 12 and the second support clasp 13 of the fixing frame 1. Accordingly, the heat sink 2 can dissipate heat of the circuit board 3'. It is preferable that a plurality of protrusions 4' corresponding to the second support clasps 13 extend from a periphery of the circuit board 3', and the second support clasps 13 are engaged with the protrusions 4' respectively.

It is also to be understood that, in the present embodiment, a width of the subsidiary accommodating space 102 is less than a width of the main accommodating space 101. However, in practice, the present invention is not limited in this regard.

It should be noted that, in the present embodiment, the hollow area 100 of the fixing frame 1 includes only one subsidiary accommodating space 102. However, in practice, the fixing frame 1 can include multiple accommodating spaces 102 at different sides around the main accommodating space 101. The subsidiary accommodating spaces 102 communicate with the main accommodating space 101 after the foldable plate 20 is removed. Therefore, the foldable plate 20 can be detached as required, so that the fixing frame 1 can be assembled to various sized circuit boards.

Figure 8:
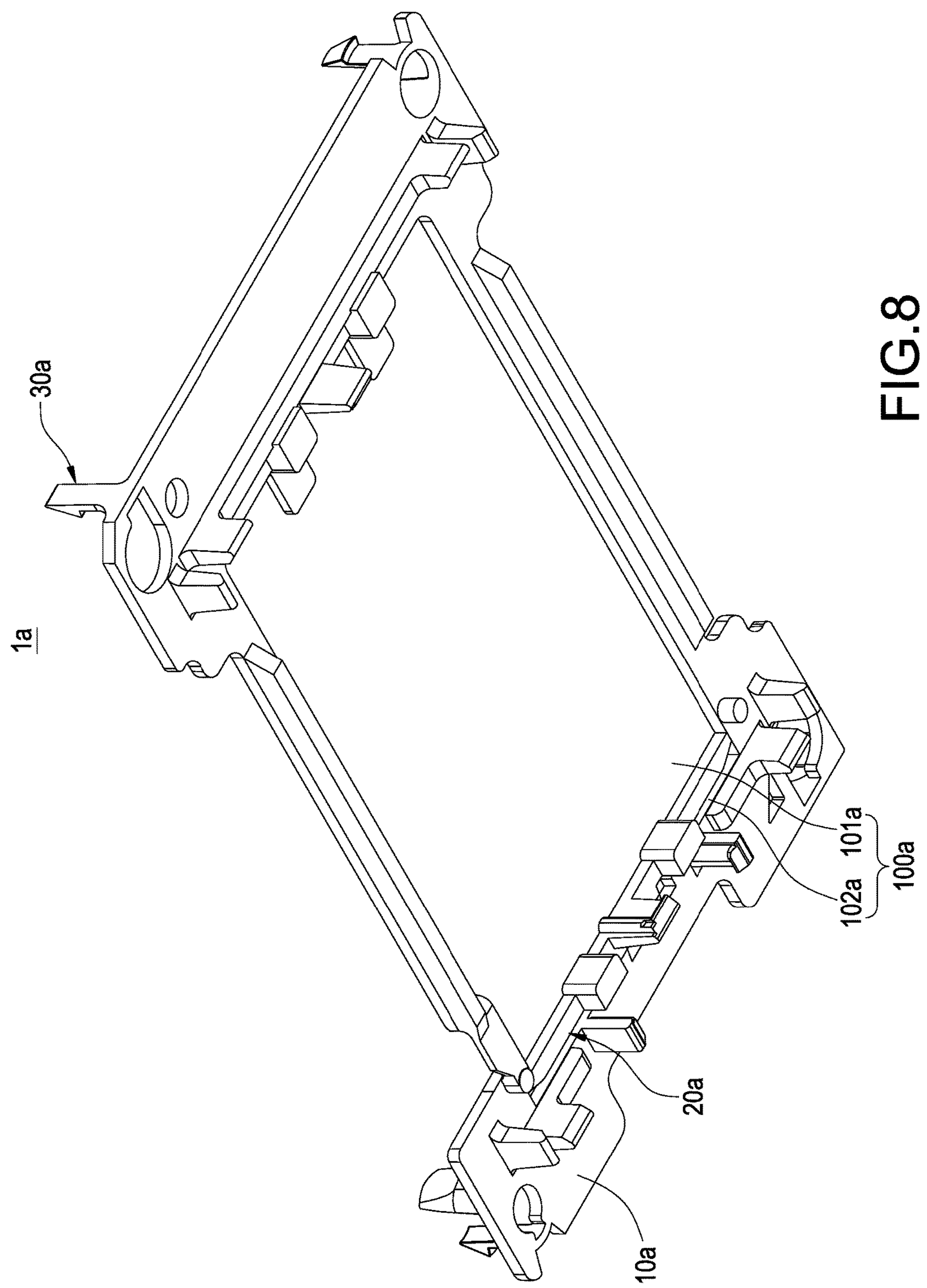
FIG. 8 is a perspective view illustrating the fixing frame according to another embodiment of the present invention.
Figure 9:
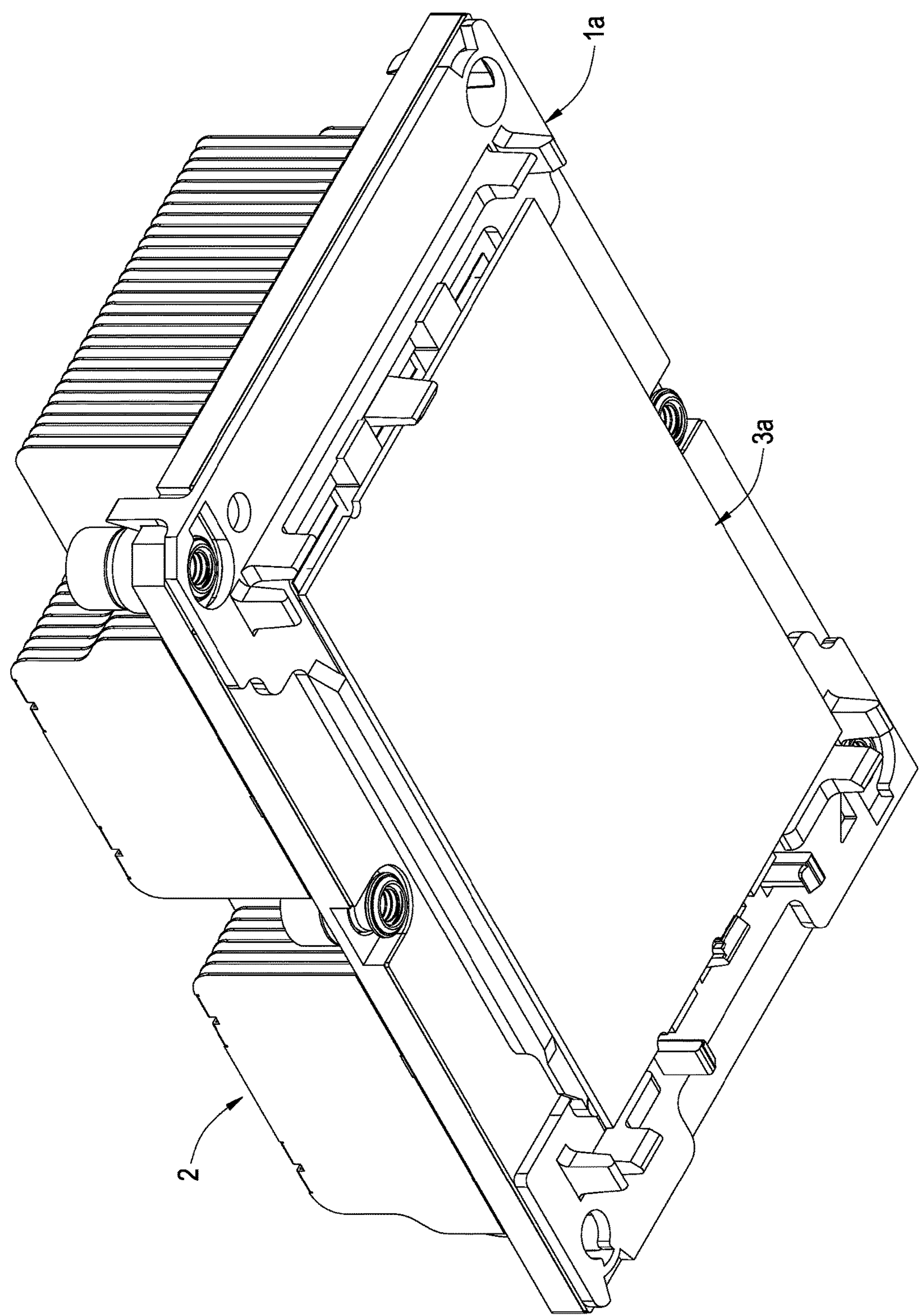
FIG. 9 is a perspective view illustrating the fixing frame assembled to the heat sink, according to the another embodiment of the present invention.

Please refer to FIGS. 8 and 9 which are a perspective view illustrating the fixing frame and a perspective view illustrating the fixing frame assembled to the heat sink according to another embodiment of the present invention. The present embodiment is similar to the previous embodiment. The fixing frame 1*a* includes a plurality of boards 10*a*, at least one foldable plate 20*a* and a plurality of connection members 30*a*. The boards 10*a* surround a hollow area 100*a*. The hollow area 100*a* includes a main accommodating space 101*a* and at least one subsidiary accommodating space 102*a*. The at least one foldable plate 20*a* is detachably connected to one of the boards 10*a*, and is disposed in the at least one subsidiary accommodating space 102*a*. The fixing frame 1*a* is adapted to be assembled to a heat sink 2. The heat sink 2 is in contact with a circuit board 3*a* by means of the fixing frame 1*a*.

The present embodiment is different from the previous embodiment in that, a width of the subsidiary accommodating space 102*a* is equal to a width of the main accommodating space 101*a*. That is to say, a width of the at least one foldable plate 20*a* is equal to a width of the main accommodating space 101*a*.

Figure 10:
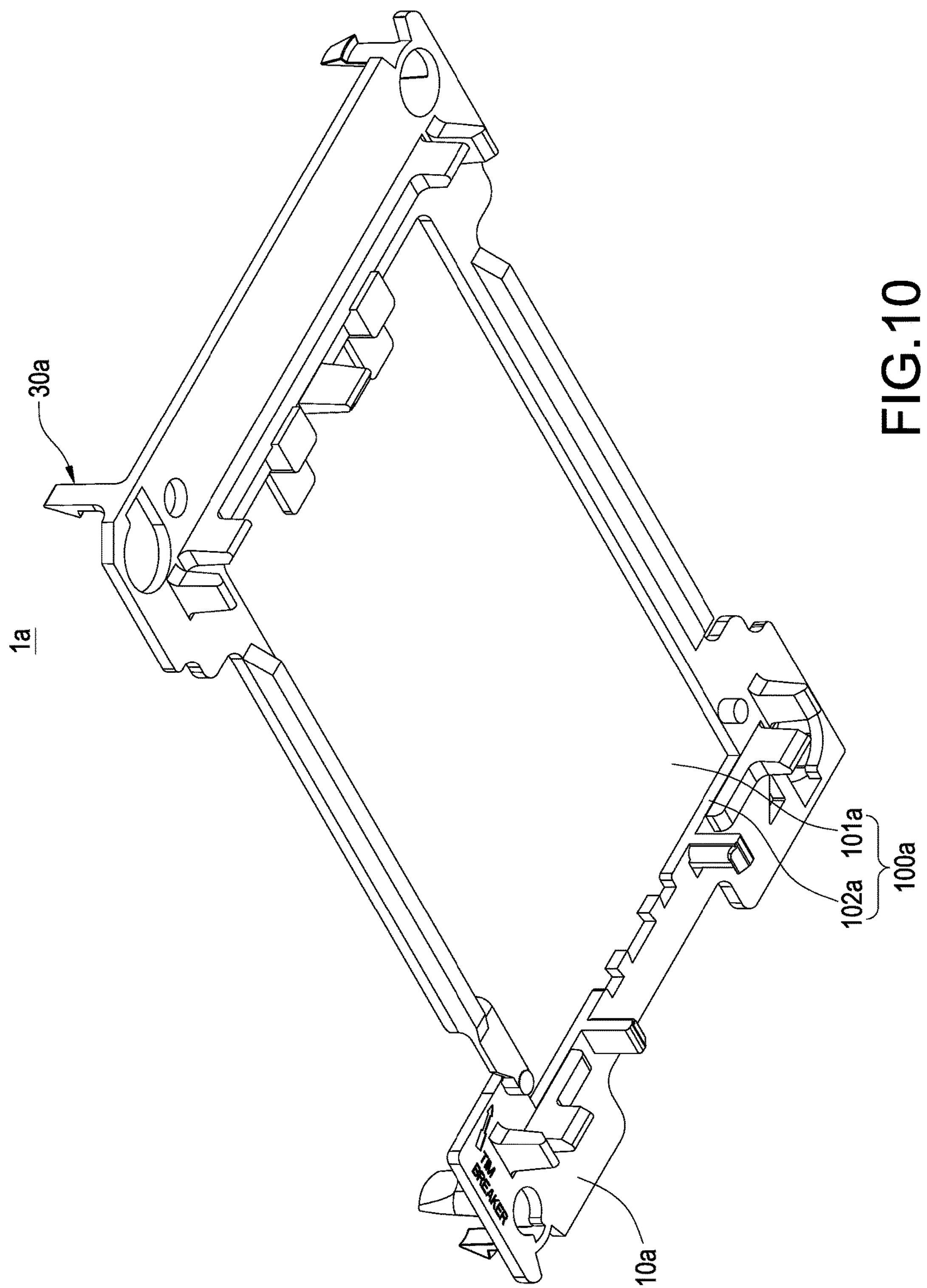
FIG. 10 is a perspective view illustrating the fixing frame after the foldable plate is removed, according to the another embodiment of the present invention.
Figure 11:
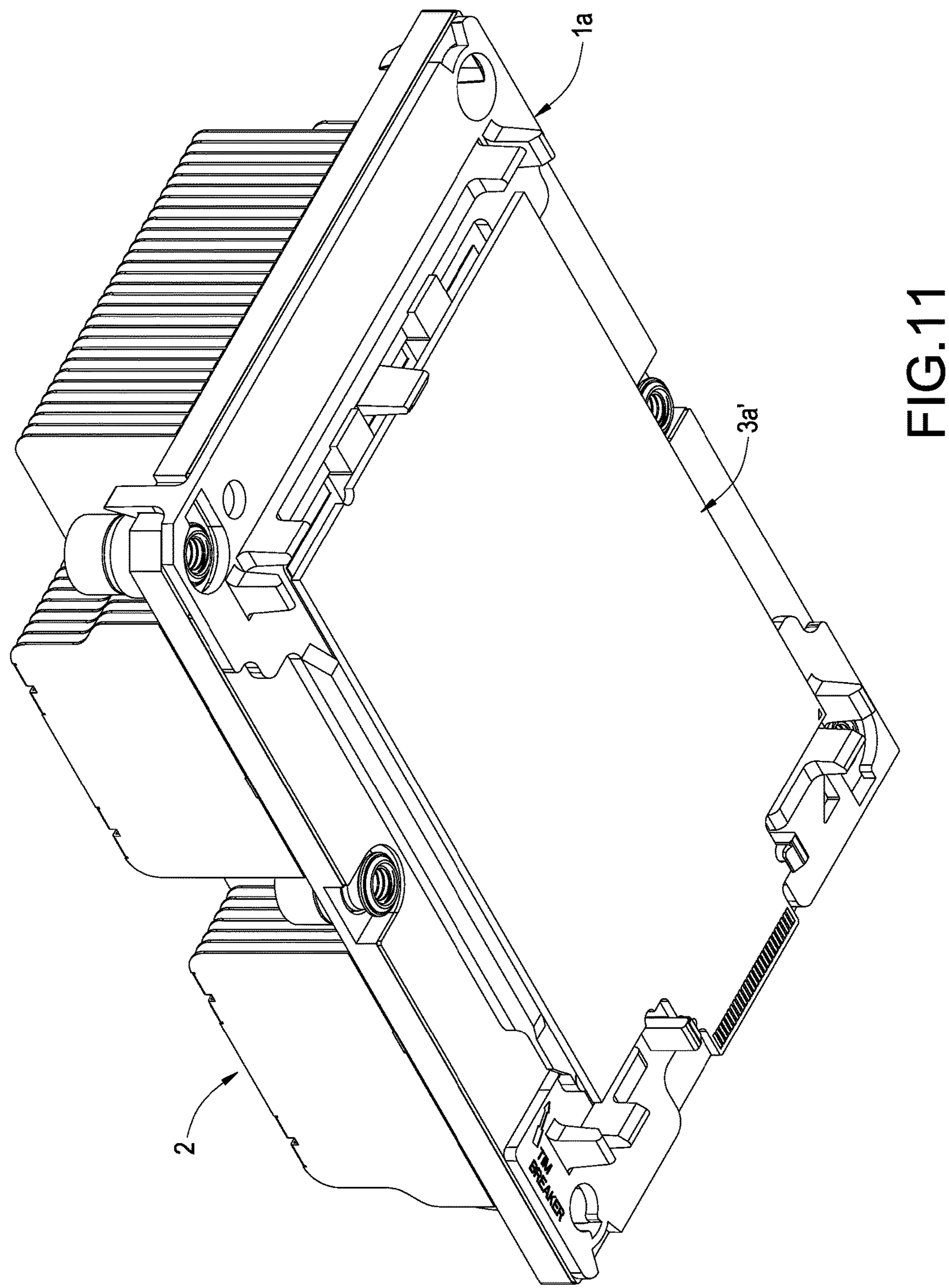
FIG. 11 is a perspective view illustrating that the heat sink is assembled to the circuit board after the foldable plate of the fixing frame is removed, according to the another embodiment of the present invention.

Referring to FIG. 10 and FIG. 11 which are a perspective view illustrating the fixing frame 1*a* after the foldable plate 20*a* is removed and a perspective view illustrating that the heat sink 2 is assembled to the circuit board after the foldable plate 20*a* of the fixing frame 1*a* is removed according to the another embodiment of the present invention. Similarly, in the fixing frame 1*a*, an adequate external force can be exerted to detach the foldable plate 20*a* from the board 10*a*. As shown in FIG. 10, after the foldable plate 20*a* is removed by the external force, the subsidiary accommodating space 102*a* is exposed, and the subsidiary accommodating space 102*a* communicates with the main accommodating space 101. As a result, the fixing frame 1*a* can be assembled to a different size circuit board.

Referring to FIG. 11, the fixing frame 1*a* is assembled to the heat sink 2 by means of multiple connection members 30*a*. The heat sink 2 is in contact with the electronic component (the heat generating element) by means of the fixing frame 1*a*. As shown in the drawing, a length of the circuit board 3*a*' exceeds the main accommodating space 101*a*. A major portion of the circuit board 3*a*' is disposed in the main accommodating space 101*a*, and a portion of the circuit board 3*a*' is positioned in the subsidiary accommodating space 102*a*. Accordingly, the heat sink 2 can dissipate heat of the circuit board 3*a*'.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A fixing frame for a heat sink, for mounting the heat sink to a circuit board to dissipate heat from an electronic component thereof, the fixing frame comprising:

a plurality of boards surrounding a hollow area, the hollow area including a main accommodating space and at least one subsidiary accommodating space at one side of the main accommodating space;

at least one foldable plate detachably connected to one of the boards and disposed in the at least one subsidiary accommodating space; and a plurality of connection members disposed on the boards, the fixing frame being assembled to the heat sink by means of the connection members, wherein a surface of the foldable plate facing the mounted heat sink is flush with a surface of the board to which the foldable plate is connected.

2. The fixing frame for the heat sink of claim 1, wherein a periphery of the foldable plate includes a plurality of connection ribs, and a gap is formed between the connection ribs and the board.

3. The fixing frame for the heat sink of claim 1, wherein the foldable plate includes a clasp at one side away from the mounted heat sink.

4. The fixing frame for the heat sink of claim 1, wherein the connection members include a plurality of flexible fasteners and a plurality of hooks, and the flexible fasteners and the hooks are disposed adjacent to corners of the main accommodating space.

5. The fixing frame for the heat sink of claim 4, wherein the flexible fasteners are arranged diagonally, and the hooks are arranged diagonally.

6. The fixing frame for the heat sink of claim 1, wherein the boards include a plurality of first support clasps, and the circuit board is positioned on the first support clasps.

7. The fixing frame for the heat sink of claim 1, wherein a width of the subsidiary accommodating space is less than a width of the main accommodating space.

8. A fixing frame for a heat sink, for mounting the heat sink to a circuit board to dissipate heat from an electronic component thereof, the fixing frame comprising:

a plurality of boards surrounding a hollow area, the hollow area including a main accommodating space and at least one subsidiary accommodating space at one side of the main accommodating space;

a plurality of connection members disposed on the boards, the fixing frame being assembled to the heat sink by means of the connection members, wherein the boards include a plurality of first support clasps, and the circuit board is positioned on the first support clasps;

wherein a plurality of second support clasps are disposed at a periphery of the subsidiary accommodating space, a plurality of protrusions corresponding to the second support clasps extend from a periphery of the circuit board, and the second support clasps are engaged with the protrusions respectively.

9. The fixing frame for the heat sink of claim 8, wherein the connection members include a plurality of flexible fasteners and a plurality of hooks, and the flexible fasteners and the hooks are disposed adjacent to corners of the main accommodating space.

10. The fixing frame for the heat sink of claim 9, wherein the flexible fasteners are arranged diagonally, and the hooks are arranged diagonally.

11. The fixing frame for the heat sink of claim 8, wherein the second support clasps are disposed at two opposite edges of the subsidiary accommodating space, a contact block extends from a bottom between the second support clasps, and when the circuit board is inserted in the subsidiary accommodating space, the circuit board is in contact with the contact block.

12. The fixing frame for the heat sink of claim 8, wherein a width of the subsidiary accommodating space is less than a width of the main accommodating space.

13. The fixing frame for the heat sink of claim 8, wherein a width of the subsidiary accommodating space is equal to a width of the main accommodating space.

* * * * *